(12) United States Patent
Catala

(10) Patent No.: US 6,456,144 B2
(45) Date of Patent: Sep. 24, 2002

(54) CIRCUIT CONFIGURATION FOR MIXING AN INPUT SIGNAL AND AN OSCILLATOR SIGNAL WITH ONE ANOTHER

(75) Inventor: Stéphane Catala, Ismaning (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 09/822,017

(22) Filed: Mar. 30, 2001

Related U.S. Application Data

(63) Continuation of application No. PCT/DE99/03102, filed on Sep. 27, 1999.

(30) Foreign Application Priority Data

Sep. 30, 1998 (DE) .......................................... 198 44 970

(51) Int. Cl.[7] .................................................. G06F 7/44
(52) U.S. Cl. ...................................... 327/359; 455/333
(58) Field of Search ................................ 327/356, 357, 327/359; 455/326, 333

(56) References Cited

U.S. PATENT DOCUMENTS

| 4,321,549 A | | 3/1982 | Hansen | |
|---|---|---|---|---|
| 4,663,594 A | * | 5/1987 | Perkins | ........................ 327/231 |
| 4,801,900 A | | 1/1989 | Mower | |
| 5,661,485 A | | 8/1997 | Manuel | |
| 5,877,643 A | * | 3/1999 | Drogi | .......................... 327/359 |

FOREIGN PATENT DOCUMENTS

| DE | 34 12 191 A1 | 10/1985 |
|---|---|---|
| DE | 41 14 943 A1 | 11/1991 |
| EP | 0 434 203 A2 | 6/1991 |
| EP | 0 714 163 A1 | 5/1996 |
| EP | 0 774 832 A1 | 5/1997 |
| EP | 0 853 374 A1 | 7/1998 |

* cited by examiner

*Primary Examiner*—Kenneth B. Wells
(74) *Attorney, Agent, or Firm*—Laurence A. Greenberg; Werner H. Stemer; Ralph E. Locher

(57) ABSTRACT

The circuit configuration mixes an input signal with an oscillator signal. A phase splitter with one input and two voltage outputs receives the oscillator signal and carries at its outputs orthogonal oscillator signals, which are phase-shifted through 90° with respect to one another. A first differential amplifier has a voltage input connected to one of the two voltage outputs of the phase splitter. A second differential amplifier has a voltage input connected to the other of the two voltage outputs of the phase splitter and one current output. A first current source controlled by the input signal supplies the first differential amplifier. A second current source that is controlled by the input signal supplies the second differential amplifier. A first phase shifter is connected downstream of the first differential amplifier, and a second phase shifter is connected downstream of the second differential amplifier. An adder device is connected downstream from the first and second differential amplifiers and produces an output signal.

6 Claims, 1 Drawing Sheet

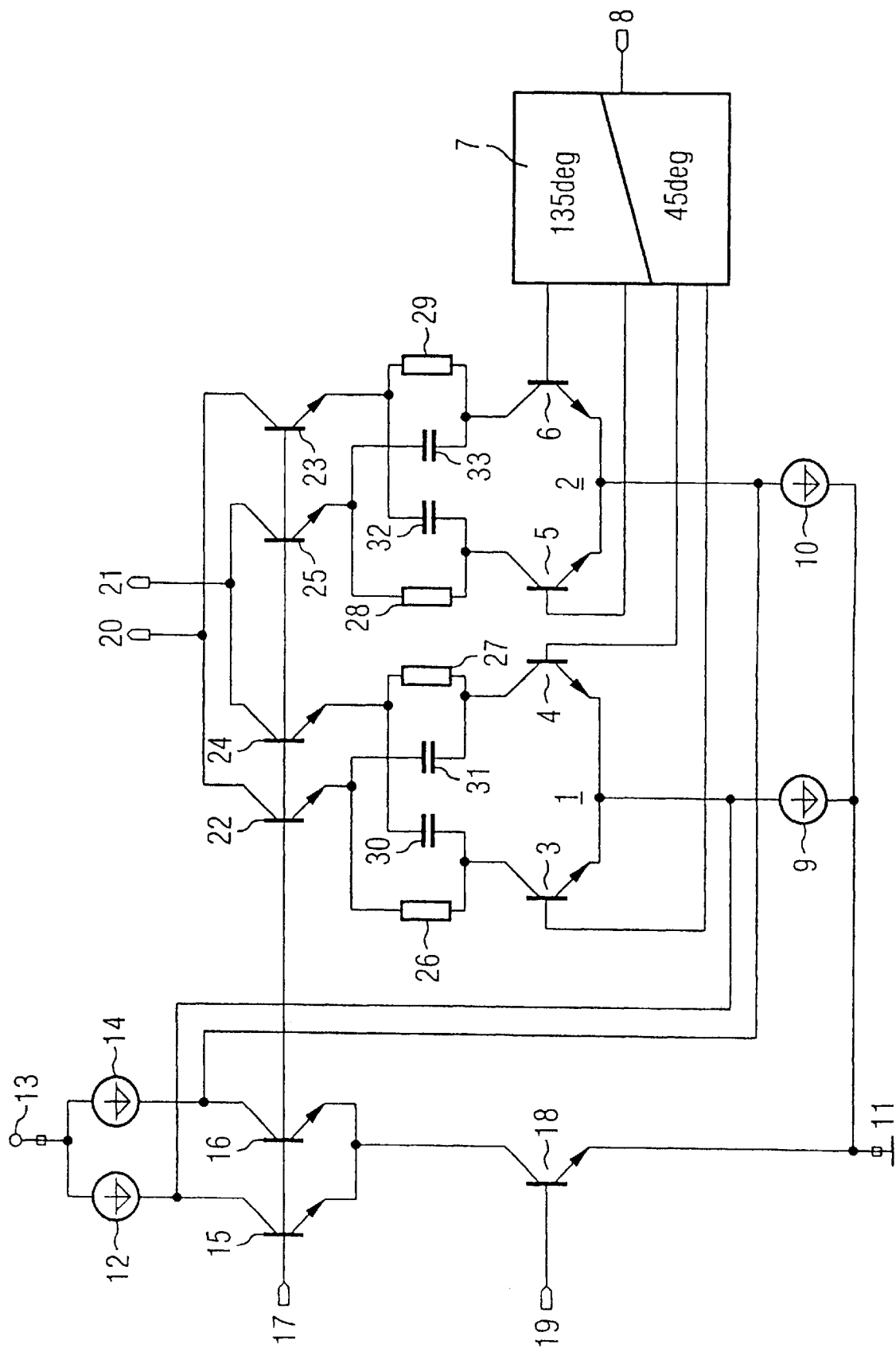

CIRCUIT CONFIGURATION FOR MIXING AN INPUT SIGNAL AND AN OSCILLATOR SIGNAL WITH ONE ANOTHER

CROSS-REFERENCE TO RELATED APPLICATION

This is a continuation of copending International Application PCT/DE99/03102, filed Sep. 27, 1999, which designated the United States.

BACKGROUND OF THE INVENTION

Field of the Invention

The invention lies in the circuit technology and electronics fields. More specifically, the invention relates to a circuit configuration for mixing an input signal and an oscillator signal with one another.

Mirror frequency suppression mixers are an advantageous solution for saving complex mirror frequency suppression filters in input receivers and for achieving greater integration. However, such mixers have the disadvantage that they require more than twice the power of a conventional mixer. The question of power consumption is of major importance in particular for mobile applications, since the power consumption in that case has a major influence particularly on the costs involved, the construction of the respective appliance, and its characteristics.

By way of example, signal frequency suppression mixers are known from U.S. Pat. Nos. 4,801,900 and 5,661,485. As a rule, such mixers comprise a low-noise input amplifier, two identical mixing stages, each having an amplifier connected to them for an oscillator signal, a phase splitter for producing two orthogonal oscillator signals from the original oscillator signal, and an output phase combiner. In that case, the input and output impedance ratios play a particular role. A more or less high input impedance for the amplifiers for the oscillator signal normally means increased power consumption. Furthermore, the insertion loss resulting from these additional elements must be compensated for by the phase combiner at the output, which once again results in increased power consumption. Conventional low-noise amplifiers are constructed as power/voltage converters with an input-side transistor (or transistor pair in a differential configuration) connected in cascode, which drives a passive load such as a parallel low-pass filter network with resistors and capacitors. Voltage/current feedback by means of a resistor requires a precisely matched input impedance in order to achieve the required linearity. Although inputs with common emitters are most suitable for low noise, they need to be operated with a very high bias current (several milliamperes), however. The power signal at the input is thus converted to a current which drives the passive load and leads to a voltage as the output signal at the output. However, large voltage signals require a corresponding DC voltage drive level margin.

Furthermore, it is necessary for the mixers to have a considerably higher input impedance than the output impedance of the amplifiers, in order to reduce the insertion loss. An input stage with a common emitter as in the case of an amplifier must be implemented in this case, and this must be subject to additional linearity requirements, owing to the amplifier gain. This linearity can be achieved by emitter degeneration, but this means that the mixer must have a very high output impedance in order to achieve a voltage converter is gain of approximately 0 dB. For its part, this once again means that a greater drive level margin is required.

The phase combiner is also subject to the same requirements as well as requiring an additional drive level margin. Thus, if the blocks are placed one on top of the other then, although the current consumption is lower, a considerable drive level margin is required, however, which does not allow operation at a low voltage, as is required for mobile applications (for example 2.7 V). On the other hand, circuit configurations in which the blocks are arranged in parallel have a far greater power consumption with otherwise poorer characteristics.

SUMMARY OF THE INVENTION

It is accordingly an object of the invention to provide a circuit configuration for mixing an input signal with an oscillator signal, which overcomes the above-mentioned disadvantages of the heretofore-known devices and methods of this general type.

With the foregoing and other objects in view there is provided, in accordance with the invention, a circuit configuration for mixing an input signal and an oscillator signal with one another, comprising:

a phase splitter having an input receiving an oscillator signal, and first and second voltage outputs carrying orthogonal oscillator signals, phase-shifted through 90° with respect to one another;

a first differential amplifier having a voltage input connected to the first voltage output of the phase splitter and a current output;

a second differential amplifier having a voltage input connected to the second voltage output of the phase splitter and a current output;

a first controllable current source connected to and supplying the first differential amplifier, the first controllable current source receiving and being controlled by an input signal;

a second controllable current source connected to and supplying the second differential amplifier, the second controllable current source receiving and being controlled by the input signal;

a first phase shifter connected downstream of the first differential amplifier in a signal flow direction, the first phase shifter having a current input and a current output;

a second phase shifter connected downstream of the second differential amplifier in the signal flow direction, the second phase shifter having a current input and a current output; and an adder device connected downstream from the first and second differential amplifiers and generating an output signal.

The present invention allows individual circuit blocks to be stacked one on top of the other in such a manner that, firstly, the bias currents can be divided by the individual blocks, and such that, on the other hand, they can themselves operate at very low supply voltages down to 2.7 V. The mixers in this case have a very low input impedance (owing to the coupled bases), and are each fed with half the current (at half the bias current level of the low-noise amplifier). Furthermore, such architecture means that only a low voltage drive level margin is required. Since the amplifiers which amplify the oscillator signal are designed such that the output impedance is sufficiently low, the mixer can be reduced to a simple switch pair which switches the oscillator signal and replaces the input stage with a common base. The phase combiner, which is constructed in a similar manner, can then, finally, also be placed on the mixer and receive the same bias current as the other circuit parts. Since the bias current levels are high, the input impedances of all the blocks are sufficiently low that a low signal loss occurs overall. The overall gain is essentially produced by the low-noise amplifier in order advantageously to compensate for higher noise levels in the mixers as a result of the signal being split at its input. Finally, stacking the phase combiner and the mixer one on top of the other allows the power consumption of the overall arrangement to be reduced considerably.

In accordance with an added feature of the invention, the first and second phase shifters each has one balanced input and one balanced output, each having one inverting and one non-inverting connection; and wherein the inverting connection of the input, the non-inverting connection of the input, the inverting connection of the output, and the non-inverting connection of the output are directly connected and cross-connected via respective two resistors and two capacitors. In other words, the two phase shifters each have one balanced input and one balanced output, each having one inverting and one non-inverting connection. In this case, the input-side inverting and non-inverting connections are respectively connected to the output-side inverting and non-inverting connections, directly and crossed over by means of two resistors and two capacitors in each case. This allows a suitable phase shifter current input and output to be provided with little circuitry complexity and using passive circuit technology. The passive implementation furthermore has the advantage that no significant additional noise is produced, as in the case of active phase shifters.

In accordance with an additional feature of the invention, the controllable current sources each have:
  a first constant current source connected in series with the respective the differential amplifier;
  a second constant current source connected in parallel with the respective the differential amplifier; and
  an amplifier stage connected in parallel with the first constant current sources.

In other words, the controllable current sources preferably have a first constant current source connected in series with the respective differential amplifier, a second constant current source connected in parallel with the respective differential amplifier, and an amplifier stage connected in parallel with the first constant current sources.

In accordance with a concomitant feature of the invention, a cascode circuit is preferably provided for the amplifier stage and/or the adder device and, in particular, is fed from a common reference voltage source.

Other features which are considered as characteristic for the invention are set forth in the appended claims.

Although the invention is illustrated and described herein as embodied in a circuit configuration for mixing an input signal and an oscillator signal with one another, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawing.

BRIEF DESCRIPTION OF THE DRAWING

The sole drawing FIGURE is a schematic circuit diagram of the circuit according to the invention.

DESCRIPTION OF THE PREFERRED EMBODIMENTS

Referring now to the figures of the drawing in detail the circuit configuration according to the invention contains two differential amplifiers 1 and 2, each with two emitter-coupled npn bipolar transistors 3, 4 and 5, 6. The bases of the transistors 3, 4 are thereby connected to a balanced output of a phase splitter 7, while the bases of the transistors 5, 6 are connected to the other balanced output of the phase splitter 7. An oscillator signal 8 is applied to the phase splitter 7. Orthogonal oscillator signals are produced at the two balanced outputs at the phase splitter 7, that is to say two signals phase-shifted through 90° with respect to one another, and which are based on the oscillator signal 8. The 90° phase shift in the exemplary embodiment is achieved in that the oscillator signal is supplied firstly to a phase shifter with a phase shift of 45°, and secondly to a phase shifter with a phase shift of 135°. This results in a phase difference of 90° between the two signals at the output of the two phase shifters, and thus of the outputs of the phase splitter 7. The balanced outputs of the phase splitter 7 are voltage outputs for driving the transistors 3, 4 and 5, 6.

The differential amplifiers 1 and 2 are fed by respectively constant current sources 9 and 10 in such a manner that the constant current source 9 is connected firstly between the coupled emitters of the transistors 3 and 4 and secondly to a reference-ground potential 11, and the constant current source 10 is connected firstly between the coupled emitters of the transistors 5 and 6 and secondly to the reference-ground potential 11. Furthermore, the coupled emitters of the transistors 3 and 4 are connected via a constant current source 12 to a positive supply potential 13, and the coupled emitters of the transistors 5 and 6 are likewise connected via a constant current source 14 to the positive supply potential 13. Furthermore, the coupled emitters of the transistors 3 and 4 together with 5 and 6 are joined together via a cascode stage, and are connected to the output of an amplifier stage. The cascode stage in the exemplary embodiment comprises two npn bipolar transistors 15 and 16, whose bases and emitters are each connected to one another. The coupled bases are in this case connected to a reference potential 17. The emitters of the transistors 15 and 16 are in this case respectively connected to the coupled emitters of the transistors 3 and 4, together with 5 and 6. The coupled emitters of the transistors 15 and 16 are, finally, connected to the collector of an npn bipolar transistor 18 whose emitter is connected to the reference-ground potential 11, and to whose base an input signal 19 is applied. The transistor 18 in this case forms an input amplifier stage, but at the same time acts in conjunction with the cascode circuit 15, 16, 17 and the current sources 9, 10, 12, 14 as a controllable current source for differential amplifiers 1 and 2.

The collectors of the transistors 3, 4, 5, 6, which form the current outputs of the differential amplifiers 1 and 2, are each followed by passive phase shifters and are routed via the phase shifters to an adder stage. The adder stage, which acts as a combiner device, for its part contains four cascode stages, whose outputs are joined together in pairs and form the balanced output 20, 21 of the circuit configuration according to the invention. In detail, the collectors of two npn bipolar transistors 22 and 23 are connected to one another and to the connection 20. In the same way, the collectors of two npn bipolar transistors 24 and 25 are connected to one another and to the output connection 21. The bases of the transistors 22, 23, 24, 25 are connected to one another and to the reference potential 17. The emitters of the transistors 22, 24 together with 23, 25 represent the current inputs of the adder inputs, while the connections 20 and 21 form the balanced current inputs of the bias circuit and of the circuit configuration according to the invention.

The two phase shifters which are respectively connected between the differential amplifiers 1 and 2 and the adder device are passive, and are formed by an RC network. To this end, the collector of the transistor 3 is in each case connected to the emitter of the transistor 22, the collector of the transistor 4 is connected to the emitter of the transistor 24, the collector of the transistor 5 is connected to the emitter of the transistor 25, and the collector of the transistor 6 is connected to the emitter of the transistor 23, via a respective non-reactive resistor 26, 27, 28, 29. Furthermore, the collector of the transistor 3 is connected to the emitter of the transistor 24, the collector of the transistor 4 is connected to the emitter of the transistor 22, the collector of the transistor 5 is connected to the emitter of the transistor 23, and the collector of the transistor 6 is connected to the emitter of the transistor 25, via a respective capacitor 30, 31, 32, 33.

The differential amplifier stages 1 and 2, the respective phase shifters and the adder stage in the form of a cascode circuit are in each case stacked one on top of the other, that is to say for current flow purposes, they are connected in series. The input amplifier is in this case used firstly for amplification and secondly, at the same time, for controlling the bias currents of the differential amplifier stages 1 and 2, and thus for multiplication. The constant current sources 9, 10, 12, 14 each supply the same current in the exemplary embodiment.

In addition to low complexity, the circuit is distinguished by low bias currents and low operating voltage. The current coupling means that no significant voltage drive level margin is required, and the impedance matching between the individual stages is virtually ideal.

I claim:

1. A circuit configuration for mixing an input signal and an oscillator signal with one another, comprising:
    a phase splitter having an input receiving an oscillator signal, and first and second voltage outputs carrying orthogonal oscillator signals, phase-shifted through 90° with respect to one another;
    a first differential amplifier having a voltage input connected to said first voltage output of said phase splitter and a current output;
    a second differential amplifier having a voltage input connected to said second voltage output of said phase splitter and a current output;
    a first controllable current source connected to and supplying said first differential amplifier, said first controllable current source receiving and being controlled by the input signal;
    a second controllable current source connected to and supplying said second differential amplifier, said second controllable current source receiving and being controlled by the input signal;
    a first phase shifter connected downstream of said first differential amplifier in a signal flow direction, said first phase shifter having a current input and a current output;
    a second phase shifter connected downstream of said second differential amplifier in the signal flow direction, said second phase shifter having a current input and a current output; and
    an adder device connected downstream from said first and second differential amplifiers and generating an output signal.

2. The circuit configuration according to claim 1, wherein each of said first and second phase shifters has one balanced input and one balanced output, each having one inverting and one non-inverting connection; and wherein said inverting connection of said input, said non-inverting connection of said input, said inverting connection of said output, and said non-inverting connection of said output are directly connected and cross-connected via respective two resistors and two capacitors.

3. The circuit configuration according to claim 1, wherein said controllable current sources each have:
    a first constant current source connected in series with the respective said differential amplifier;
    a second constant current source connected in parallel with the respective said differential amplifier; and
    an amplifier stage connected in parallel with said first constant current sources.

4. The circuit configuration according to claim 3, wherein said amplifier stage has a cascode circuit.

5. The circuit configuration according to claim 1, wherein said adder device has a cascode circuit.

6. The circuit configuration according to claim 3, wherein said amplifier stage and said adder device have cascode circuits fed from a common reference voltage source.

* * * * *